(12) United States Patent
Winstead et al.

(10) Patent No.: US 9,843,414 B2
(45) Date of Patent: Dec. 12, 2017

(54) LOW COMPLEXITY ERROR CORRECTION

(71) Applicants: Chris Winstead, Providence, UT (US); Gopalakrishnan Sundararajan, Chennai (IN); Emmanuel Boutillon, Lorient (FR)

(72) Inventors: Chris Winstead, Providence, UT (US); Gopalakrishnan Sundararajan, Chennai (IN); Emmanuel Boutillon, Lorient (FR)

(73) Assignee: Utah State University, Logan, UT (US)

(*) Notice: Subject to any disclaimer, the term of this patent is extended or adjusted under 35 U.S.C. 154(b) by 9 days.

(21) Appl. No.: 14/788,150

(22) Filed: Jun. 30, 2015

(65) Prior Publication Data

US 2016/0006543 A1 Jan. 7, 2016

Related U.S. Application Data

(60) Provisional application No. 62/019,614, filed on Jul. 1, 2014.

(51) Int. Cl.
| | |
|---|---|
| *G06F 11/10* | (2006.01) |
| *H04L 1/00* | (2006.01) |
| *H03M 13/43* | (2006.01) |
| *H03M 13/35* | (2006.01) |

(52) U.S. Cl.
CPC ........ *H04L 1/0063* (2013.01); *H03M 13/353* (2013.01); *H03M 13/43* (2013.01); *H04L 1/0051* (2013.01); *H04L 1/0057* (2013.01)

(58) Field of Classification Search
CPC ........................................................ G06F 11/10
USPC ................................. 714/800, 758, 718, 701
See application file for complete search history.

(56) References Cited

U.S. PATENT DOCUMENTS

| | | | | |
|---|---|---|---|---|
| 6,980,602 | B1* | 12/2005 | Kleinerman | H04L 1/0047 327/1 |
| 8,868,988 | B2* | 10/2014 | Sun | H04L 1/0068 714/701 |
| 2004/0170430 | A1* | 9/2004 | Gorokhov | H04L 1/0618 398/41 |
| 2006/0045062 | A1* | 3/2006 | Gorokhov | H04L 1/0041 370/343 |
| 2012/0230379 | A1* | 9/2012 | Mo | H04L 25/067 375/224 |

OTHER PUBLICATIONS

Sopalakrichnan, S. et al., Noisy Gradient Descent Bit-Flip Decoding for LDPC Codes, IEEE Transactions on communications, Oct. 17, 2014, 3385-3400, vol. 62, No. 10, IEEE.
Winstead, C. et al., Recent results on bit-flipping LDPC decoders, National School of Telecommunications of Brittany, Apr. 23, 2014, Brest, France.

(Continued)

*Primary Examiner* — Fritz Alphonse

(57) ABSTRACT

For low complexity error correction, a decoder modifies each reliability metric of an input data stream with a random perturbation value. The reliability metric comprises a weighted sum of a channel measurement for the input data stream and parity check results for the input data stream. In addition, the decoder may generate an output data stream as a function of the reliability metrics.

18 Claims, 9 Drawing Sheets

(56) References Cited

OTHER PUBLICATIONS

Tithi, T. et al., Decoding LDPC codes via Noisy Gradient Descent Bit-Flipping with Re-Decoding, arXiv:1503.08913, Mar. 31, 2015.
Winstead et al., Decoding LDPC Codes With Locally Maximum-Likelihood Binary Messages, IEEE Communications Letters, Dec. 1, 20014, vol. 18, No. 12.
R. Gallager, "Low-Density Parity-Check Codes", www.rle.mit.edu/rgallager/documents/ldpc.pdf, Jul. 1963, 90 pages.
Y. Kou et al., "Low-Denisty Parity-Check Codes Based on Finite Geometries: A Rediscovery and New Results", IEEE Transactions on Information Theory vol. 47 No. 7, Nov. 2001, pp. 2711-2736.
N. Miladinovic et al., "Improved Bit-Flipping Decoding of Low-Density Parity-Check Codes", IEEE Transactions on Information Theory, vol. 51, No. 4, Apr. 2005, pp. 1594-1606.
T. Wadayama et al., "Gradient Descent Bit Flipping Algorithms for Decoding LDPC Codes", https://arxiv.org/pdf/0711.0261.pdf, Apr. 8, 2008, 6 pages.
D. Rasheed et al., "Fault-Tolerant Probabilistic Gradient-Descent Bit Flipping Decoder", IEEE Communications Letters, vol. 18, No. 9, Sep. 2014, pp. 1487-1490.
G. Sundararajan et al., "ASIC Design of a Noisy Gradient Descent Bit Flip Decoder for 10GBASE-T Ethernet Standard", Cornell University Library, https://arxiv.org/abs/1608.06272, Aug. 22, 2016.

\* cited by examiner

145

255　310　456

| | | | |
|---|---|---|---|
| X1 | 1 | 0.85 | 0.550 |
| X2 | -1 | 0.62 | 0.420 |
| X3 | 1 | 0.43 | 0.250 |
| X4 | 1 | 0.57 | 0.390 |
| X5 | 1 | 0.77 | 0.480 |
| X6 | -1 | 0.65 | 0.450 |
| X7 | -1 | 0.71 | 0.500 |
| X8 | 1 | 0.48 | 0.300 |
| X9 | -1 | 0.81 | 0.530 |
| X10 | -1 | 0.79 | 0.490 |
| ... | | | |
| Xn | -1 | 0.82 | 0.540 |

FIG. 3

LOW COMPLEXITY ERROR CORRECTION

CROSS-REFERENCE TO RELATED APPLICATIONS

This application claims priority to U.S. Provisional Patent Application Ser. No. 62/019,614 entitled "LOW COMPLEXITY ERROR CORRECTION" and filed on Jul. 1, 2014 for Chris Winstead, which is incorporated herein by reference.

BACKGROUND

Field

The subject matter disclosed herein relates to error correction and more particularly relates to low complexity error correction.

Description of the Related Art

Data channels are often noisy, resulting in data errors that must be corrected.

BRIEF SUMMARY OF THE INVENTION

A method for low complexity error correction is disclosed. The method modifies each reliability metric of an input data stream with a random perturbation value. The reliability metric comprises a weighted sum of a channel measurement for the input data stream and parity check results for the input data stream. The method further generates an output data stream as a function of the reliability metrics.

BRIEF DESCRIPTION OF THE DRAWINGS

In order that the advantages of the embodiments of the invention will be readily understood, a more particular description of the embodiments briefly described above will be rendered by reference to specific embodiments that are illustrated in the appended drawings. Understanding that these drawings depict only some embodiments and are not therefore to be considered to be limiting of scope, the embodiments will be described and explained with additional specificity and detail through the use of the accompanying drawings, in which:

FIG. 3 is a table illustrating one embodiment of an output data stream;

DETAILED DESCRIPTION OF THE INVENTION

Figure 1:
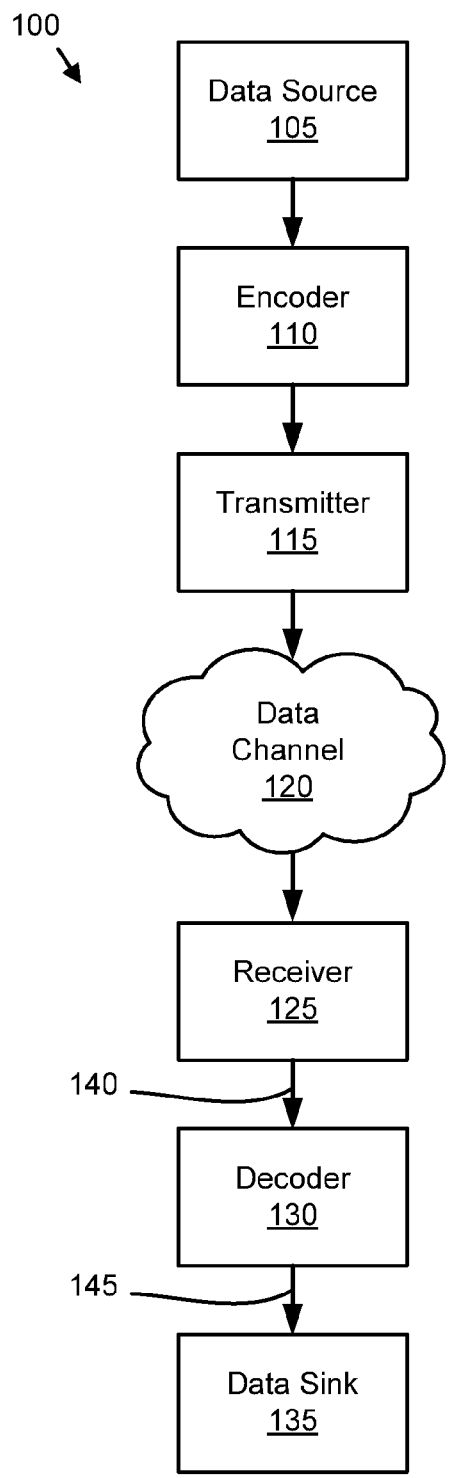
FIG. 1 is a schematic block diagram illustrating one embodiment of an error correction system.

As will be appreciated by one skilled in the art, aspects of the embodiments may be embodied as a system, method or program product. Accordingly, embodiments may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, embodiments may take the form of a program product embodied in one or more computer readable storage devices storing machine readable code, computer readable code, and/or program code, referred hereafter as code. The storage devices may be tangible, non-transitory, and/or non-transmission. The storage devices may not embody signals. In a certain embodiment, the storage devices only employ signals for accessing code.

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices or the like.

Modules may also be implemented in code and/or software for execution by various types of processors. An identified module of code may, for instance, comprise one or more physical or logical blocks of executable code which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of code may be a single instruction, or many instructions, and may even be distributed over several different code segments, among different programs, and across several memory devices. Similarly, operational data may be identified and illustrated herein within modules, and may be embodied in any suitable form and organized within any suitable type of data structure. The operational data may be collected as a single data set, or may be distributed over different locations including over different computer readable storage devices. Where a module or portions of a module are implemented in software, the software portions are stored on one or more computer readable storage devices.

Any combination of one or more computer readable medium may be utilized. The computer readable medium may be a computer readable storage medium. The computer readable storage medium may be a storage device storing the code. The storage device may be, for example, but not limited to, an electronic, magnetic, optical, electromagnetic, infrared, holographic, micromechanical, or semiconductor system, apparatus, or device, or any suitable combination of the foregoing.

More specific examples (a non-exhaustive list) of the storage device would include the following: an electrical connection having one or more wires, a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Code for carrying out operations for embodiments may be written in any combination of one or more programming languages, including an object oriented programming language such as Python, Ruby, Java, Smalltalk, C++ or the like and conventional procedural programming languages, such as the "C" programming language or similar programming languages. The code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Reference throughout this specification to "one embodiment," "an embodiment," or similar language means that a particular feature, structure, or characteristic described in connection with the embodiment is included in at least one embodiment. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to," unless expressly specified otherwise. An enumerated listing of items does not imply that any or all of the items are mutually exclusive, unless expressly specified otherwise. The terms "a," "an," and "the" also refer to "one or more" unless expressly specified otherwise.

Furthermore, the described features, structures, or characteristics of the embodiments may be combined in any suitable manner. In the following description, numerous specific details are provided, such as examples of programming, software modules, user selections, network transactions, database queries, database structures, hardware modules, hardware circuits, hardware chips, etc., to provide a thorough understanding of embodiments. One skilled in the relevant art will recognize, however, that embodiments may be practiced without one or more of the specific details, or with other methods, components, materials, and so forth. In other instances, well-known structures, materials, or operations are not shown or described in detail to avoid obscuring aspects of an embodiment.

Aspects of the embodiments are described below with reference to schematic flowchart diagrams and/or schematic block diagrams of methods, apparatuses, systems, and program products according to embodiments. It will be understood that each block of the schematic flowchart diagrams and/or schematic block diagrams, and combinations of blocks in the schematic flowchart diagrams and/or schematic block diagrams, can be implemented by code. These code may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the schematic flowchart diagrams and/or schematic block diagrams block or blocks.

The code may also be stored in a storage device that can direct a computer, other programmable data processing apparatus, or other devices to function in a particular manner, such that the instructions stored in the storage device produce an article of manufacture including instructions which implement the function/act specified in the schematic flowchart diagrams and/or schematic block diagrams block or blocks.

The code may also be loaded onto a computer, other programmable data processing apparatus, or other devices to cause a series of operational steps to be performed on the computer, other programmable apparatus or other devices to produce a computer implemented process such that the code which execute on the computer or other programmable apparatus provide processes for implementing the functions/acts specified in the flowchart and/or block diagram block or blocks.

The schematic flowchart diagrams and/or schematic block diagrams in the Figures illustrate the architecture, functionality, and operation of possible implementations of apparatuses, systems, methods and program products according to various embodiments. In this regard, each block in the schematic flowchart diagrams and/or schematic block diagrams may represent a module, segment, or portion of code, which comprises one or more executable instructions of the code for implementing the specified logical function(s).

It should also be noted that, in some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated Figures.

Although various arrow types and line types may be employed in the flowchart and/or block diagrams, they are understood not to limit the scope of the corresponding embodiments. Indeed, some arrows or other connectors may be used to indicate only the logical flow of the depicted embodiment. For instance, an arrow may indicate a waiting or monitoring period of unspecified duration between enumerated steps of the depicted embodiment. It will also be noted that each block of the block diagrams and/or flowchart diagrams, and combinations of blocks in the block diagrams and/or flowchart diagrams, can be implemented by special purpose hardware-based systems that perform the specified functions or acts, or combinations of special purpose hardware and code.

The description of elements in each figure may refer to elements of proceeding figures. Like numbers refer to like elements in all figures, including alternate embodiments of like elements.

Sundarajan, Gopalakrishnan; Winstead, Chris; and Boutillon, Emmanuel; "Noisy Gradient Descent Bit-Flip Decoding for LDPC Codes" (Gopalakrishnan) and Winstead, Chris; Sundarajan, Gopalakrishnan; and Boutillon, Emmanuel; "Recent Results on Bit-Flipping LDPC Decoders" (Winstead) are incorporated herein by reference.

FIG. 1 is a schematic block diagram illustrating one embodiment of an error correction system 100. The system 100 includes a data source 105, an encoder 110, a transmitter 115, a data channel 120, a receiver 125, a decoder 130, and a data sink 135. The system 100 may communicate data from the data source 105 to the data sink 135.

The data source 105 may generate data. The encoder 110 may encode the data for transmission using one or more encoding algorithms to increase transmission accuracy. For example, the encoder 110 may append an error correction code and/or parity check code.

The transmitter 115 may transmit the encoded data over the data channel 120. The data channel 120 may include a wireless channel, a fiber-optic channel, and/or an electrical channel. In addition, the data channel 120 may include one or more networks including the Internet, a wide area network, a local area network, a mobile telephone network, or combinations thereof.

The data channel 120 may introduce noise to the data. As a result, when the data is received at the receiver 125, the representation of the data values may differ from those originally transmitted from the transmitter 115. In one embodiment, the receiver 125 receives the data as analog values and generates digital values from the analog values that are communicated in an input data stream 140. For example, the receiver 125 may receive the analog voltage values 0.4, −0.2, −0.5, and −0.9 Volts and generate the digital binary values +1, −1, −1, −1.

In one embodiment, the data channel 120 is assumed to introduce white Gaussian noise. The white Gaussian noise may have a variance about a mean value.

The decoder 130 receives the input data stream 140 from the receiver 125 and generates an output data stream 145. The decoder 130 may correct transmission errors due to noise in the data. The data may then be received by the data sink 135.

The data is typically transmitted through the system 100 with redundancies including redundant data, parity check codes, error codes, and the like so that transmission errors may be detected and corrected. However, recovering the transmitted data using the redundancies can also be costly, requiring significant hardware resources. The embodiments described herein reduce the cost of transmitting data by using a reliability metric that is used to generate the output data stream 145.

Unless fully redundant data is transmitted with the data, the decoder cannot deterministically identify which bits of the input data stream 140 are erroneous. However, transmitting fully redundant data decreases data throughput and increases costs. As a result, the data is often transmitted with only partially redundant data. The decoder 130 may easily determine from the redundancies of the input data stream 140 that an error has occurred. For example, the decoder 130 may perform an error correction code check, such as a parity check, on the input data stream 140. However, the decoder 130 must still determine which bit or bits are in error.

The decoder 130 may employ a bit flipping algorithm to correct the transmission errors. If the error correction code check indicates that there is an error correction code error, the decoder 130 may flip one or more bits in the input data stream 140 that are likely sources of the error to correct the data. The decoder 130 then determines if flipping the bit corrected the error. The embodiments employ a reliability metric to select the bits to flip. Making an intelligent choice as to which bits to flip increases the efficiency of the error correction for the input data stream.

In one embodiment, the decoder 130 calculates a reliability metric $\delta$ for each bit in the input data stream 140 as will be described hereafter. In the event of an error, the decoder 130 may generate the output data stream 145 using the reliability metric by iteratively inverting a bit of the input data stream 140 with the lowest reliability metrics in response to the error correction code error. Alternatively, the decoder 130 may generate the output data stream 145 by iteratively inverting each bit of the input data stream 140 with reliability metric less than a bit error threshold in response to the error correction code error. The decoder 130 may continue inverting bits until the error correction code error is resolved or until a maximum time limit is reached.

In one embodiment, the reliability metrics for bits of the input data stream 140 comprise a weighted sum of a channel measurement for the input data stream 140 and parity check results for the input data stream 140. The decoder 130 may modify each reliability metric with a random perturbation value. The decoder 130 may then generate the output data stream 145 as a function of the reliability metrics.

The decoder 130 may process the reliability metrics of the bits of the input data stream 140 modified with the random perturbations. The decoder 130 may terminate processing the bits of the input data stream 140 in response to one of all parity checks being satisfied and/or the maximum time limit being reached. In addition, the decoder 130 may apply smoothing filter to the data output stream 145 if the processing is terminated in response to the maximum time limit being reached without all parity checks being satisfied.

The bit error threshold may be calculated as a function of the channel noise of the data channel 120. In one embodiment, the bit error threshold is dynamically adjusted higher during each iteration of processing the input bits of the input data stream 140 in which a bit is not inverted.

Figure 2A:
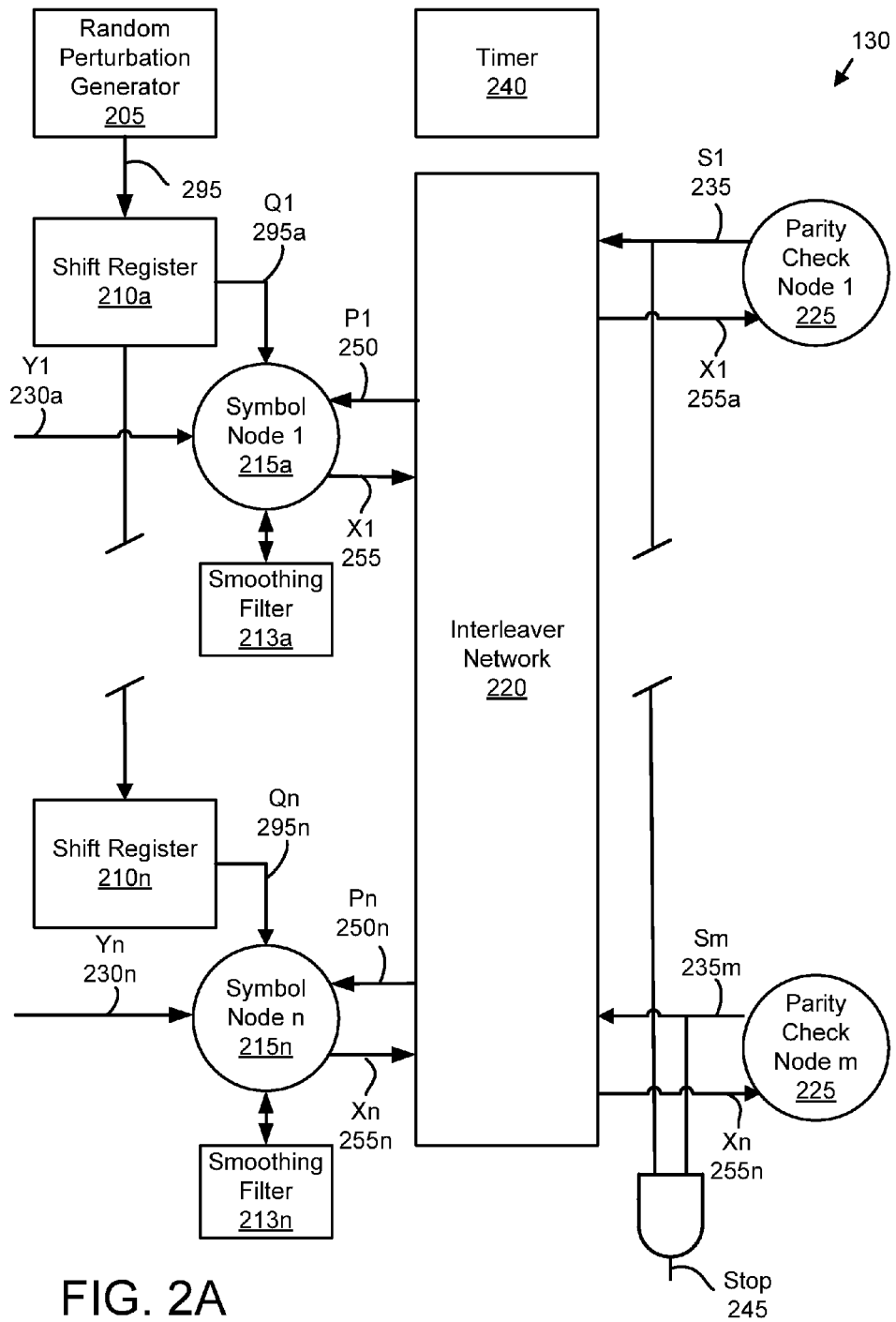
FIG. 2A is a schematic block diagram illustrating one embodiment of a decoder.

FIG. 2A is a schematic block diagram illustrating one embodiment of the decoder 130. In the depicted embodiment, the decoder 130 is embodied in a plurality of semiconductor gates and/or devices. Alternatively, the decoder 130 may be embodied in a processor and computer readable storage medium with the processor executing code stored by the computer readable storage medium. In the depicted embodiment, the decoder 130 includes a random number generator 205, one or more shift registers 210, one or more symbol nodes 215, one or more smoothing filters 213, a timer 240, an interleaver network 220, and one or more parity check nodes 225.

The input data stream 140 is divided input a plurality input bits 230. For simplicity, the processing of two input bits 230 is shown. However, the decoder 130 may process any number of input bits 230 from the input data stream 140.

The random number generator 205 may generate random perturbation values 295. The operation of the random number generator 205 is described in more detail in FIG. 2C. A first random perturbation value 295 may be latched by a first shift register 210a and used to modify the first input bit Y1 230a. The first random perturbation value 295 may subsequently be latched by a second shift register 210 while a second random perturbation value 295 is latched by the first shift register 210a. Thus a first random perturbation value 295 for a first reliability metric in a first output data stream 145 is a second random perturbation value 295 for a second reliability metric in a second output data stream 145. As a result, the first random perturbation value 295 successive modifies each input bit 230.

In the depicted embodiment, the random perturbation value 295 from each shift register 210 modifies the reliability metric for an input bit y 230 at a symbol node 215. The symbol nodes 215 generate output bits x 255 that are routed by the interleaver network 220 and checked at the parity check nodes 225. The output bits x 255 may initially be hypothesis decisions until generation of the output data stream 145 is complete.

The interleaver network 220 may connect the output bit 255 from each symbol node 215 to each parity check node 225. The connections facilitated by the interleaver network 220 are shown in FIG. 2B.

Parity check results 235 from the parity check nodes 225 are fed back through the interleaver network 220 to the symbol nodes 215 as syndrome messages P 250 that are used to iteratively generate the output bits x 225. The smoothing filter 213 may modify the output bits x 255 as will be described hereafter.

The timer 240 may determine when the maximum time limit has been reached. When the maximum time limit is reached, the decoder 130 may stop processing the output bits 255, even if there is an error such as an unsatisfied parity check.

Figure 2B:
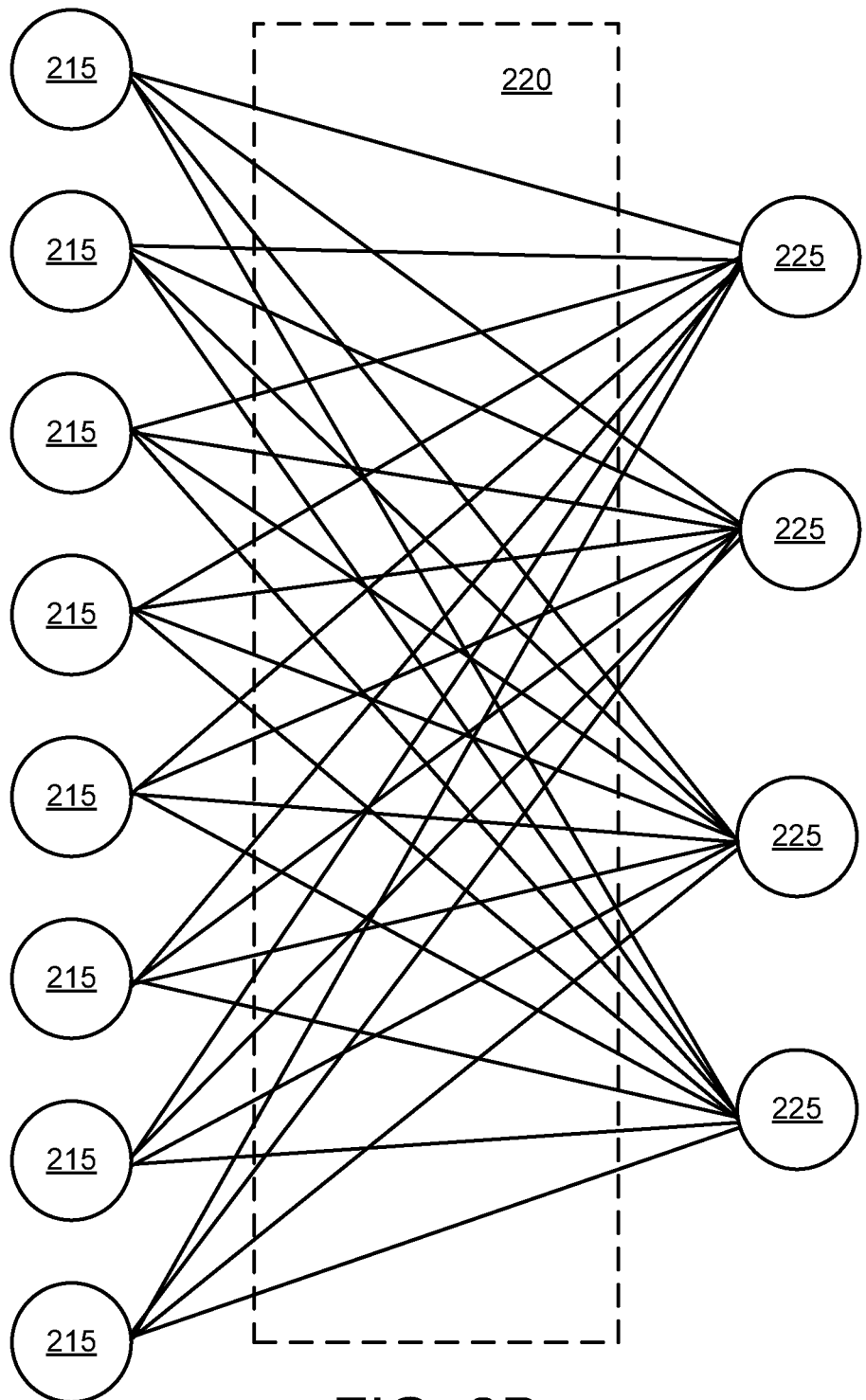
FIG. 2B is a schematic block diagram illustrating one embodiment of symbol node/parity check node relationships.

FIG. 2B is a schematic block diagram illustrating one embodiment of symbol node 215/parity check node 225 relationships supported by the interleaver 220. In the depicted embodiment, the interleaver 220 allows N symbol nodes 215 to communicate with each of M parity check nodes 225. N and M may be any integer values.

Figure 2C:
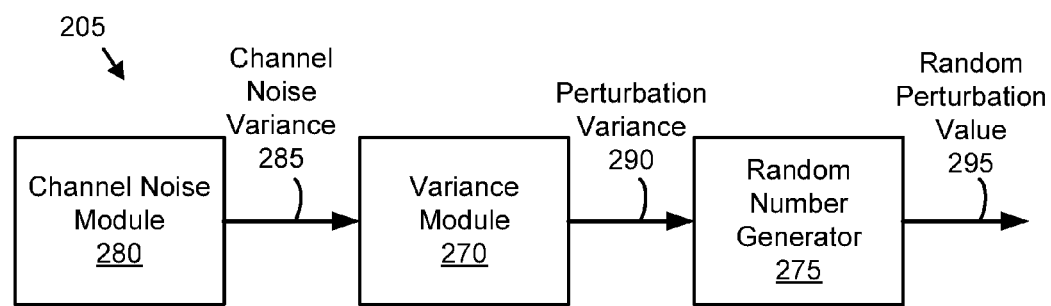
FIG. 2C is a schematic block diagram illustrating one embodiment of a random perturbation generator.

FIG. 2C is a schematic block diagram illustrating one embodiment of a random perturbation generator 205. In the depicted embodiment, the random perturbation generator 205 includes a channel noise module 280, a variance module 270, and a random number generator 275. The channel noise module 280, variance module 270, and random number generator 275 may be implemented as semiconductor gates.

The channel noise module 280 may monitor the data channel 120 and characterize the noise of the data channel 120. The channel noise module 280 may determine a mean and a variance for a Gaussian of the noise for the data channel 120. The channel noise module 280 may communicate a channel noise variance 285 to the variance module 270.

The variance module may determine a perturbation variance 290 as a function of the channel noise variance 285. In one embodiment, the random perturbation values 295 are selected to have a perturbation variance 290 that is a function of channel noise of the data channel 120. The perturbation variance VP may be calculated using Equation 1, where VC is the channel noise variance 285 and k is a real-valued non-zero positive number.

$$VP = k*VC \qquad \text{Equation 1}$$

Figure 2D:
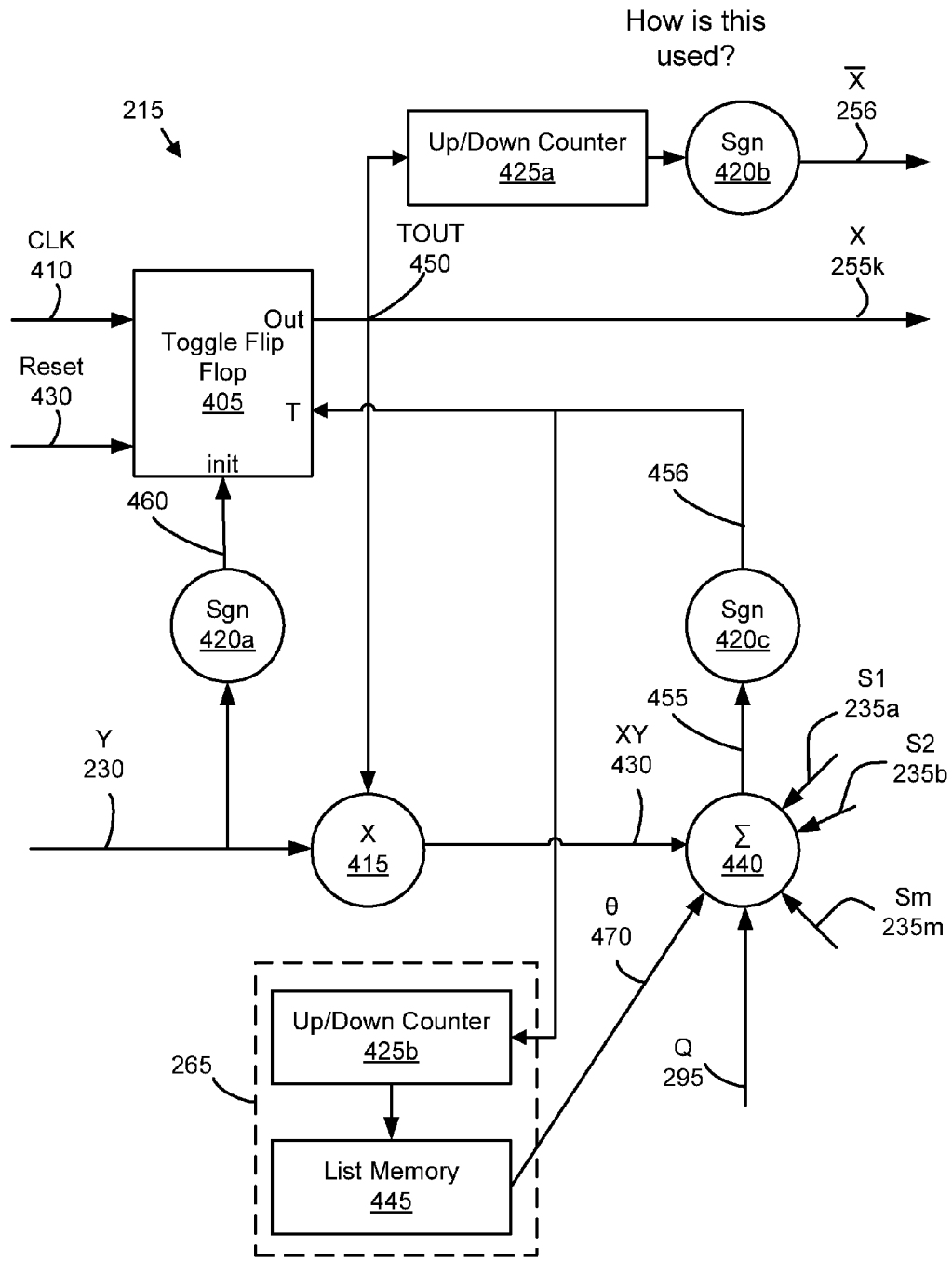
FIG. 2D is a schematic block diagram illustrating one embodiment of a symbol node.

FIG. 2D is a schematic block diagram illustrating one embodiment of the symbol node 215. The symbol node 215 may be implemented as semiconductor gates. In the depicted embodiment, the symbol node 215 includes a toggle flip-flop 405, a multiplier 415, one or more sign modules 420, one or more up/down counters 425, a summer 440, and a list memory 445.

The toggle flip-flop 405 is initialized to the value of the input bit Y 230. A reset signal 430 may reset the toggle flip-flop 405. An output of the toggle flip-flop 405 may invert the output of the toggle flip-flop if input T and the clock 410 are asserted. The clock 410 may demark iterations of processing the output bits 255 of the output data stream 145.

The output of the toggle flip-flop 405, TOUT 450, is the output bit x 225. The multiplier 415 may multiply an input bit Y 230 and the output bit x 225 to yield XY 430. The summer 440 sums XY 430 with the random perturbation value 295, a quantized threshold θ 470 generated by a quantized threshold circuit 265, the parity check results S 235 for the input bit Y 230, and the perturbation value Q 295 to yield an inverse reliability metric δ 455. The inverse reliability metric δ 455 may be multiplied by a weight. A sign module 420c generates a reliability metric δ 456 that when asserted toggles the toggle flip-flop 405 and the output bit x 255.

The quantized threshold circuit 265 may determine the quantized threshold θ 470 as a function of the reliability metric 456. The second up/down counter 425b maintains a running count of the reliability metric 456. The list memory 445 may generate the quantized threshold 470 as a function of the running count of the reliability metric δ 456. In one embodiment, the list memory 445 generates the quantized threshold θ 470 using Equation 2.

$$\tilde{\theta} = \begin{cases} \tilde{\theta}_j & \text{if sign } (\delta_k(t)) = +1 \\ \tilde{\theta}_{j-1} & \text{if sign } (\delta_k(t)) = -1 \text{ and } j > 0 \\ \tilde{\theta}_0 & \text{otherwise} \end{cases} \qquad \text{Equation 2}$$

FIG. 3 is a table illustrating one embodiment of an output data stream 145. The output data stream 145 includes a plurality of output bits x 255 with corresponding analog voltage values 310. In addition, the table includes a reliability metric 456 for each output bit 255. The output bits 255 may be initially generated from the analog voltage values 310. The embodiments may correct errors in the output bits 255 as will be described hereafter.

Figure 4A:
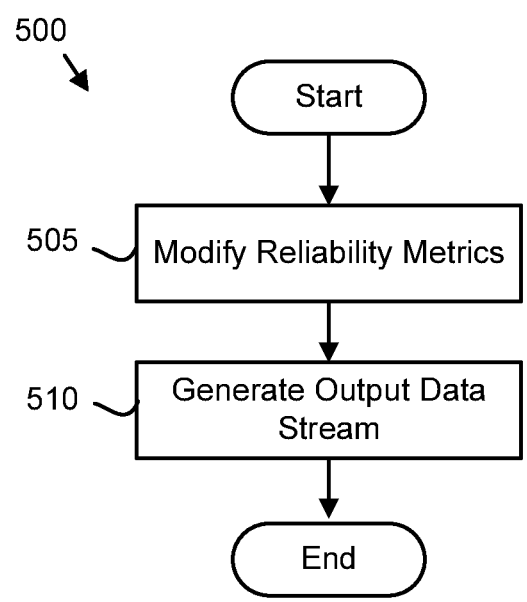
FIG. 4A is a schematic flow chart diagram illustrating one embodiment of an error correction method.

FIG. 4A is a schematic flow chart diagram illustrating one embodiment of an error correction method 500. The method 500 may be performed by the decoder 130 and/or the system 100. Alternatively, the method 500 may be performed by a processor and/or a computer readable storage medium storing code executable by the processor.

The method 500 starts and in one embodiment, the decoder 130 modifies 505 each reliability metric 456 with a random perturbation value 295. One embodiment of the calculation of the reliability metric δ 456 is illustrated in FIG. 2D.

Figure 4B:
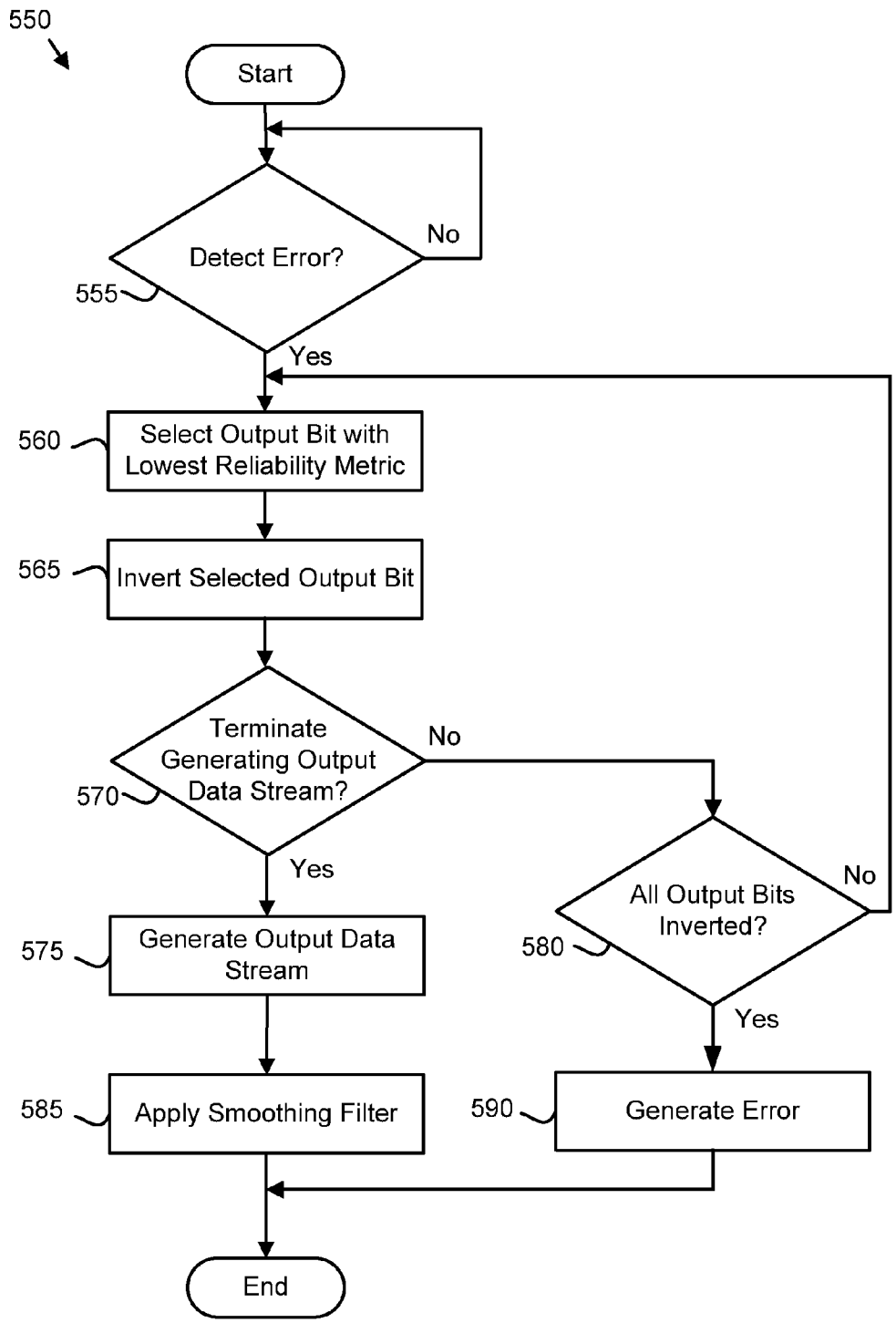
FIG. 4B is a schematic flow chart diagram illustrating one embodiment of an output data stream generation method.
Figure 4C:
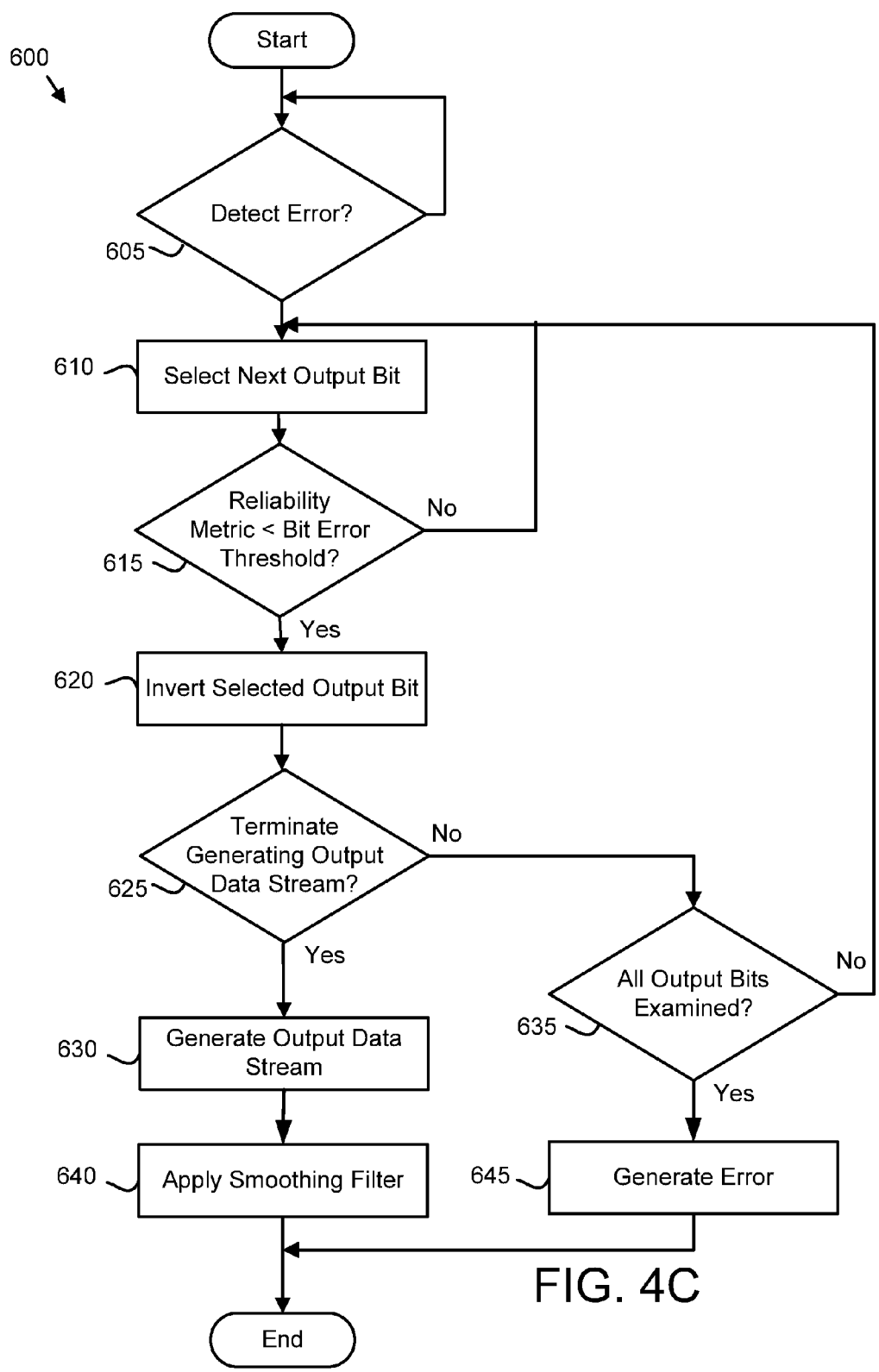
FIG. 4C is a schematic flow chart diagram illustrating one alternate embodiment of an output data stream generation method.

In addition, the decoder 130 may generate 510 an output data stream 145 as a function of the reliability metric 456 and the method 500 ends. Two embodiments of generating 510 the output data stream 145 as a function of the reliability metric 456 are illustrated in FIGS. 4B and 4C FIG. 4B is a schematic flow chart diagram illustrating one embodiment of an output data stream generation method 550. The method 550 is one embodiment of the generate output data stream step 510 of FIG. 4A. The method 550 may be performed by the decoder 130.

The method 550 starts, and in one embodiment, the decoder 130 detects 555 an error in the output bits 255. The error may be an error correction code error such as a parity check error. The parity check nodes 225 of the decoder 130 may detect 555 the error. If no errors are detected, the decoder 130 continues to monitor for an error. The output data 145 may be generated from the output bits 255 without modification.

If the decoder 130 detects 555 the error, the decoder 130 selects 560 the output bit 255 with the lowest reliability metric 456. In the example of FIG. 3, the X3 output bit 255 may be selected as having the lowest reliability metric 456. The decoder 130 may further invert 565 the selected output bit 255. For example, the reliability metric 456 may toggle the toggle flip-flop 405 and the output bit 255.

The decoder 130 may determine 570 whether to terminate generating the output data stream 145. In one embodiment, the decoder 130 terminates generating the output data stream 130 if the error is corrected. For example, if all parity checks are satisfied, the decoder 130 made terminate generating the output data stream 145. In addition, the decoder 130 may terminate generating the output data stream 145 in response to the maximum time limit being reached. The decoder 130 may terminate generating the output data stream 145 in response to the maximum time limit being reached, even without errors such as parity checks being satisfied.

If the decoder 130 determines 570 not to terminate generating the output data stream 145, the decoder 130 determines 580 if all output bits 255 have been inverted. If all output bits 255 have been inverted, the decoder 130 may generate 590 an error signal and the method 550 ends. If all output bits 255 have not been inverted, the decoder 130 selects 560 a next output bit 255 with the lowest reliability metric 456. In the example of FIG. 3, the decoder 130 may next select 560 the X8 output bit 255 as having the next lowest reliability metric 456.

If the decoder 130 determines 570 to terminate generating the output data stream 145, the decoder 130 may generate 575 the output data stream 145. The output data stream 145 combines the initial values of the output bits 255 with the inverted values of the output bits 255.

In one embodiment, the decoder applies 585 the smoothing filter 213 and the method 550 ends. The smoothing filter 213 may be applied 585 to the output data stream 145 if the processing of the output bits 255 is terminated in response to the maximum time limit being reached without all parity checks being satisfied. In one embodiment, the smoothing filter 213 is an up/down counter. The modified output bit $d_i$ 255 may be calculated using Equation 3 for each output bit $x_i$ 255 at time t.

$$d_i = \text{sign}(\Sigma_{t=T}^{T+64} x_i(t))$$ Equation 3

FIG. 4C is a schematic flow chart diagram illustrating one alternate embodiment of an output data stream generation method 600. The method 600 is one embodiment of the generate output data stream step 510 of FIG. 4A. The method 600 may be performed by the decoder 130.

The method 600 starts, and in one embodiment, the decoder 130 detects 605 an error in the output bits 255. The error may be an error correction code error. The parity check nodes 225 of the decoder 130 may detect 555 the error. If no errors are detected, the decoder 130 continues to monitor for an error and generates the output bits 255 as the output data stream 145.

If the decoder 130 detects 605 the error, the decoder 130 selects 610 each output bit 255 with a reliability metric 456 that is less than a bit error threshold. In one embodiment, the decoder 130 iteratively tests 615 each output bit 255 for a reliability metric 456 that is less than the bit error threshold. In the example of FIG. 3, if the bit error threshold is 0.35, the X3 and X8 output bits 255 may be selected.

The decoder 130 may further invert 620 the selected output bits 255. For example, the reliability metric 456 may toggle the toggle flip-flop 405 for the selected output bits 255.

The decoder 130 may determine 625 whether to terminate generating the output data stream 145. In one embodiment, the decoder 130 terminates generating the output data stream 145 if the error is corrected. For example, if all parity checks are satisfied, the decoder 130 made terminate generating the output data stream 145. In addition, the decoder 130 may terminate generating the output data stream 145 in response to the maximum time limit being reached. The decoder 130 may terminate generating the output data stream 145 in response to the maximum time limit being reached, even without errors such as all parity checks being satisfied.

If the decoder 130 determines 625 not to terminate generating the output data stream 145, the decoder 130 determines 635 if all output bits 255 have been inverted. If all output bits 255 have been inverted, the decoder 130 may generate 635 an error signal and the method 600 ends. If all output bits 255 have not been inverted, the decoder 130 may increase the bit error threshold and select 610 next output bits 255 with reliability metrics 456 less than the bit error threshold. In one embodiment, the bit error threshold is dynamically adjusted higher during each iteration in which an output bit is not inverted.

If the decoder 130 determines 625 to terminate processing, the decoder 130 may generate 630 the output data stream 145. The output data stream 145 combines the initial values of the output bits 255 with the inverted values of the output bits 255.

In one embodiment, the decoder applies 640 the smoothing filter 213 and the method 600 ends. The smoothing filter 213 may be applied 640 to the output data stream 145 if the processing of the output bits 255 is terminated in response to the maximum time limit being reached without all parity checks being satisfied. In one embodiment, the smoothing filter 213 is an up/down counter. The modified output bit $d_i$ 255 may be calculated using Equation 3 for each output bit $x_i$ 255 at time t.

The embodiments modify reliability metrics of the input data stream 140 with the random perturbation values 295. The random perturbation values 295 may move estimates of values for output bits 255 away from local maximums, increasing the probability that the output bits 255 will settle on a global maximum and a correct output bit 255 when output bits 255 are selected and inverted.

The embodiments may be practiced in other specific forms. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A method comprising:
   modifying, by use of semiconductor gates, each reliability metric of an input data stream with a random perturbation value, wherein the reliability metric comprises a weighted sum of a channel measurement for the input data stream and parity check results for the input data stream and the random perturbations have a variance that is a function of channel noise of a data channel; and
   generating an output data stream as a function of the reliability metrics, wherein the output data stream is generated by iteratively inverting a bit of the input data stream with a lowest reliability metric in response to an error correction code error.

2. The method of claim 1, wherein the variance VP is calculated as VP=k*VC where VC is a variance of the channel noise and k is a real-valued positive number.

3. The method of claim 1, wherein the output data stream is further generated by iteratively inverting each bit of the input data stream with a reliability metric less than a bit error threshold in response to an error correction code error.

4. The method of claim 3, wherein the bit error threshold is dynamically adjusted higher during each iteration in which an output bit is not inverted.

5. The method of claim 1, wherein generating the output data stream is terminated in response all parity checks being satisfied or a maximum time limit being reached.

6. The method of claim 5, wherein a smoothing filter is applied to the data output stream if the generation of the output data stream is terminated in response to the maximum time limit being reached without all parity checks being satisfied.

7. The method of claim 1, wherein a first random perturbation value for a first reliability metric in a first output data stream is a second random perturbation value for a second reliability metric in a second output data stream.

8. A apparatus comprising:
a decoder comprising semiconductor gates that modifies each reliability metric of an input data stream with a random perturbation value, wherein the reliability metric comprises a weighted sum of a channel measurement for the input data stream and parity check results for the input data stream and the random perturbations have a variance that is a function of channel noise of a data channel and generates an output data stream as a function of the reliability metrics, wherein the output data stream is generated by iteratively inverting a bit of the input data stream with a lowest reliability metric in response to an error correction code error.

9. The apparatus of claim 8, wherein the variance VP is calculated as VP=k*VC where VC is a variance of the channel noise and k is a real-valued positive number.

10. The apparatus of claim 8, wherein the output data stream is further generated by iteratively inverting each bit of the input data stream with a reliability metric less than a bit error threshold in response to an error correction code error.

11. The apparatus of claim 10, wherein the bit error threshold is dynamically adjusted higher during each iteration in which an output bit is not inverted.

12. The apparatus of claim 8, wherein generating the output data stream is terminated in response all parity checks being satisfied or a maximum time limit being reached.

13. The apparatus of claim 12, wherein a smoothing filter is applied to the data output stream if the processing of the output data stream is terminated in response to the maximum time limit being reached without all parity checks being satisfied.

14. The apparatus of claim 8, wherein a first random perturbation value for a first reliability metric in a first output data stream is a second random perturbation value for a second reliability metric in a second output data stream.

15. A system comprising:
a receiver that receives encoded data from a data channel; and
a decoder comprising semiconductor gates that modifies each reliability metric of an input data stream with a random perturbation value, wherein the reliability metric comprises a weighted sum of a channel measurement for the input data stream and parity check results for the input data stream and the random perturbations have a variance that is a function of channel noise of a data channel and generates an output data stream as a function of the reliability metrics, wherein the output data stream is generated by iteratively inverting a bit of the input data stream with a lowest reliability metric in response to an error correction code error.

16. The system of claim 15, wherein the variance VP is calculated as VP=k*VC where VC is a variance of the channel noise and k is a real-valued positive number.

17. The system of claim 15, wherein the output data stream is further generated by iteratively inverting each bit of the input data stream with a reliability metric less than a bit error threshold in response to an error correction code error.

18. The system of claim 15, wherein generating the output data stream is terminated in response all parity checks being satisfied or a maximum time limit being reached.

* * * * *

UNITED STATES PATENT AND TRADEMARK OFFICE
CERTIFICATE OF CORRECTION

PATENT NO. : 9,843,414 B2  
APPLICATION NO. : 14/788150  
DATED : December 12, 2017  
INVENTOR(S) : Winstead et al.

Page 1 of 1

It is certified that error appears in the above-identified patent and that said Letters Patent is hereby corrected as shown below:

In the Specification

Column 1, Line 11, add titled "GOVERNMENT RIGHTS" with the following text, between the "CROSS-REFERENCE TO RELATED APPLICATIONS" and "BACKGROUND" sections: "This invention was made with Government support under grant # ECCS0954747 awarded by the National Science Foundation. The Government has certain rights in the invention."

Signed and Sealed this  
Twenty-first Day of September, 2021

Drew Hirshfeld  
*Performing the Functions and Duties of the*  
*Under Secretary of Commerce for Intellectual Property and*  
*Director of the United States Patent and Trademark Office*